United States Patent [19]

Asendorf et al.

[11] Patent Number: 4,612,545
[45] Date of Patent: Sep. 16, 1986

[54] AUTOMATIC FREQUENCY IDENTIFIER FOR RADAR SIGNALS

[75] Inventors: Robert H. Asendorf, Los Altos; James P. Fitzpatrick, Santa Clara; Burton W. Graves, Monte Sereno, all of Calif.

[73] Assignee: Itek Corporation, Beverly Hills, Calif.

[21] Appl. No.: 633,823

[22] Filed: Jul. 24, 1984

Related U.S. Application Data

[63] Continuation-in-part of Ser. No. 327,281, Dec. 3, 1981, abandoned.

[51] Int. Cl.[4] .......................... G01S 7/36; G01R 23/16
[52] U.S. Cl. ................................ 343/18 E; 324/77 B; 364/485
[58] Field of Search .............. 343/18 E; 364/484, 485; 324/77 B

[56] References Cited

U.S. PATENT DOCUMENTS

| | | | |
|---|---|---|---|
| 3,939,411 | 2/1976 | James | 343/18 E X |
| 4,075,630 | 2/1978 | Shapiro et al. | 343/5 DP |
| 4,208,632 | 6/1980 | Sheldon et al. | 343/5 FT X |
| 4,215,344 | 7/1980 | Phillips, Jr. | 343/18 E |
| 4,301,454 | 11/1981 | Bailey | 343/18 E |
| 4,305,159 | 12/1981 | Stromswold et al. | 364/485 X |
| 4,321,680 | 3/1982 | Bertrand et al. | 364/485 |
| 4,336,541 | 6/1982 | Tsui et al. | 343/5 SA X |
| 4,408,284 | 10/1983 | Kijesky et al. | 364/485 |
| 4,426,648 | 1/1984 | Tsui et al. | 343/5 SA X |
| 4,471,445 | 9/1984 | Pernick | 364/485 |

Primary Examiner—T. H. Tubbesing
Assistant Examiner—John B. Sotomayor
Attorney, Agent, or Firm—Roy L. Brown; Homer O. Blair

[57] ABSTRACT

The invention provides a means for determining rapidly and accurately frequency information of electromagnetic radiation. It combines the operation of an Instantaneous Frequency Measurement receiver with the operation of an Instantaneous Fourier Transform receiver which utilizes a Laser-Bragg cell-photodetector array. The operational characteristics of the two receivers are such that, when they are controlled by signal processing elements, including a programmable frequency memory screen to enable or inhibit data transfers, they complement each other to provide the combined advantages of both receiver types, namely broad RF bandwidth, rapid response, ability to deal with high pulse densities, multiple CW signals, combined CW and pulse signals. The complementary IFM/IFT system operates under conditions for which either receiver operating separately would fail.

15 Claims, 2 Drawing Figures

AUTOMATIC FREQUENCY IDENTIFIER FOR RADAR SIGNALS

CROSS-REFERENCE TO RELATED APPLICATIONS

This is a Continuation-in-Part of U.S. patent application Ser. No. 06/327,281 which was filed Dec. 3, 1981 and abandoned on June 13, 1984 for a "Electromagnetic Signal Receiver and Process for Providing Frequency Data of Received Signals."

BACKGROUND OF THE INVENTION

1. Field of the Invention

The invention consists principally of an Instantaneous Frequency Measurement Receiver (hereinafter called an IFM), and an Instantaneous Fourier Transform Receiver (hereinafter called an IFT) operating in a parallel and complementary manner controlled by other signal processing and control elements which enable the IFM and the IFT to function in a synergistic manner to produce a rapid identification of the frequencies of incoming radar signals, and the like.

2. Description of Related Art

U.S. Pat. No. 4,075,630 issued Feb. 21, 1978 to Gerald N. Shapiro, et. al. for a "Signal Processor".

This patent pertains to apparatus for detecting pulse doppler signals, then removing them by frequency filtering. It uses a Fast Fourier Transform Processor which is a different apparatus from an Instantaneous Fourier Transform Receiver. A discussion of Fourier transforms is presented to distinguish a Fast Fourier Transform Processor from an Instantaneous Fourier Transform Receiver.

See the book "Theory and Application of Digital Signal Processing" by L. Rabiner & Gold, published by Prentice Hall in 1975 for a thorough discussion of the relation between Finite Fourier Transforms, Fast Fourier Transforms and Fourier series as applied to periodic function as contrasted to Fourier Integrals which do not pertain to periodic functions.

A Finite Time to Frequency Fourier transform is a mathematical transformation transforming a periodic function of time into a function of frequency. A finite number of, preferably uniformly, spaced apart samples of amplitude of the time function are taken over one period of the time function. Finite Fourier Transforms are made, using those samples, to obtain the coefficients of the terms of an infinite sine, cosine or $e^{j\Omega t}$ series. One term of the series is the dc or zero frequency component, and the remaining terms of the series have angular frequencies corresponding to the fundamental angular frequency, $\Omega$, of the time-periodic function which was sampled and an infinite number of harmonics thereof. Some of the coefficients may be zero. When the Fourier Series is properly factored, the number of steps for obtaining the coefficients is reduced, and the transforms are called "Fast Fourier Transforms".

When the time function to be transformed is not periodic, a Fourier Integral is used to obtain a measurement of the frequency function that corresponds to the time function.

An Instantaneous Fourier Transform (IFT) Receiver performs a Fourier Integral transformation of a pulse or CW into its component frequencies, and such transformation is extremely rapid compared, for example, to the transformation of a signal by a Fast Fourier Transformation Apparatus. The IFT may be an acousto-optic device, but it is intended to include other apparatus which will or does operate with the speed of such device to produce simultaneous and instantaneous frequency information. A Bragg Cell used as an IFT displays all of the component frequencies in, for example, one or two nanoseconds after receipt of a radar pulse.

An Instantaneous Fourier Transform Receiver, is a predetection apparatus. The incoming signal is first separated simultaneously into its frequency components, and those components are simultaneously detected or sensed. A good discussion of such transformations may be found in the book "Acousto-Optic Signal Processing" edited by Norman J. Berg and John N. Lee, published by Marcel Dekker, Inc., 1983. A discussion of Acousto-optical Fourier transformation commences on page 19.

The apparatus of the Shapiro, et. al. patent, however, is a Fast Fourier Transform apparatus that is designed to detect pulse doppler signals and to filter them out. It is a post-detection device. The signals are first detected, then the signal is resolved by an iterative process in a computer into its frequency components. Such apparatus must be preceded by high-speed analog/digital conversion pulse sample and hold circuitry. It may not be assumed that the analog/digital means is already incorporated in the FFT box. Further, such apparatus are subject to aliasing effects which do not appear in an IFT.

U.S. Pat. No. 4,208,632 issued June 17, 1980 to Edward J. Sheldon, et. al. for a "Radar Receiver".

The Sheldon, et. al patent pertains to a radar receiver which includes a plurality of intermediate frequency and video frequency amplifiers with each of the amplifiers arranged to process received signals within a different range of amplitudes so that the overall dynamic range of such receiver may be equivalent to the dynamic range of a conventional radar receiver with automatic gain control.

U.S. Pat. No. 4,336,541 issued June 22, 1982 to James B. Y. Tsui, et. al. for a "Simultaneous Signal Detector for an Instantaneous Frequency Measurement Receiver".

This patent pertains to a Simultaneous Signal Detector (SSD) apparatus for use with an Instantaneous Frequency Measurement (IFM) Receiver having an alarm signal indicating that the output frequency signal of the IFM is ambiguous because the IFM has latched onto two signals. So, too, in the apparatus of this invention, it is desirable to determine when the DIGITAL FREQUENCY output of the IFM is ambiguous, and to tag ambiguous frequency readings. An SSD is used for that purpose, but the preferred apparatus is different than that shown in the patent.

SUMMARY OF THE INVENTION

When an incoming signal is received by the system of the invention, it is sent to both an IFM and an IFT subsystem for processing. However, the signal flow path which leads to the IFT contains a delay line which delays the signal. The time delay is chosen to be sufficiently long to allow certain adaptive signal processing conditions to be determined. In addition, means are provided to inhibit or enable delivery of the signal to the IFT.

More generally signal processing elements including the use of a frequency memory screen are used to establish conditional data transfer modes throughout the system. These are used to mask or more generally to regulate the response of the system to a broad variety and admixture of incoming signals. The purpose of the conditional transfer modes is to keep unwanted signals at specific frequencies out of the subsequent data processing channels. This provision enables the system to process more high priority signals per unit time because the unwanted or uninteresting signals are removed before the data reaches the computer (not shown).

It is therefore an object of the invention to identify the frequencies of incoming radio frequency signals and to use the best features of both IFM and IFT receivers while doing so.

It is a more particular object of the invention to control IFM and IFT receivers according to the character of incoming signals and to channel such signals to the receiver that can best identify the incoming signal frequency.

BRIEF DESCRIPTION OF THE DRAWINGS

Other objects will become apparent from the following description, taken together with the accompanying drawings, in which.

DESCRIPTION OF THE PREFERRED EMBODIMENT

Figure 1:
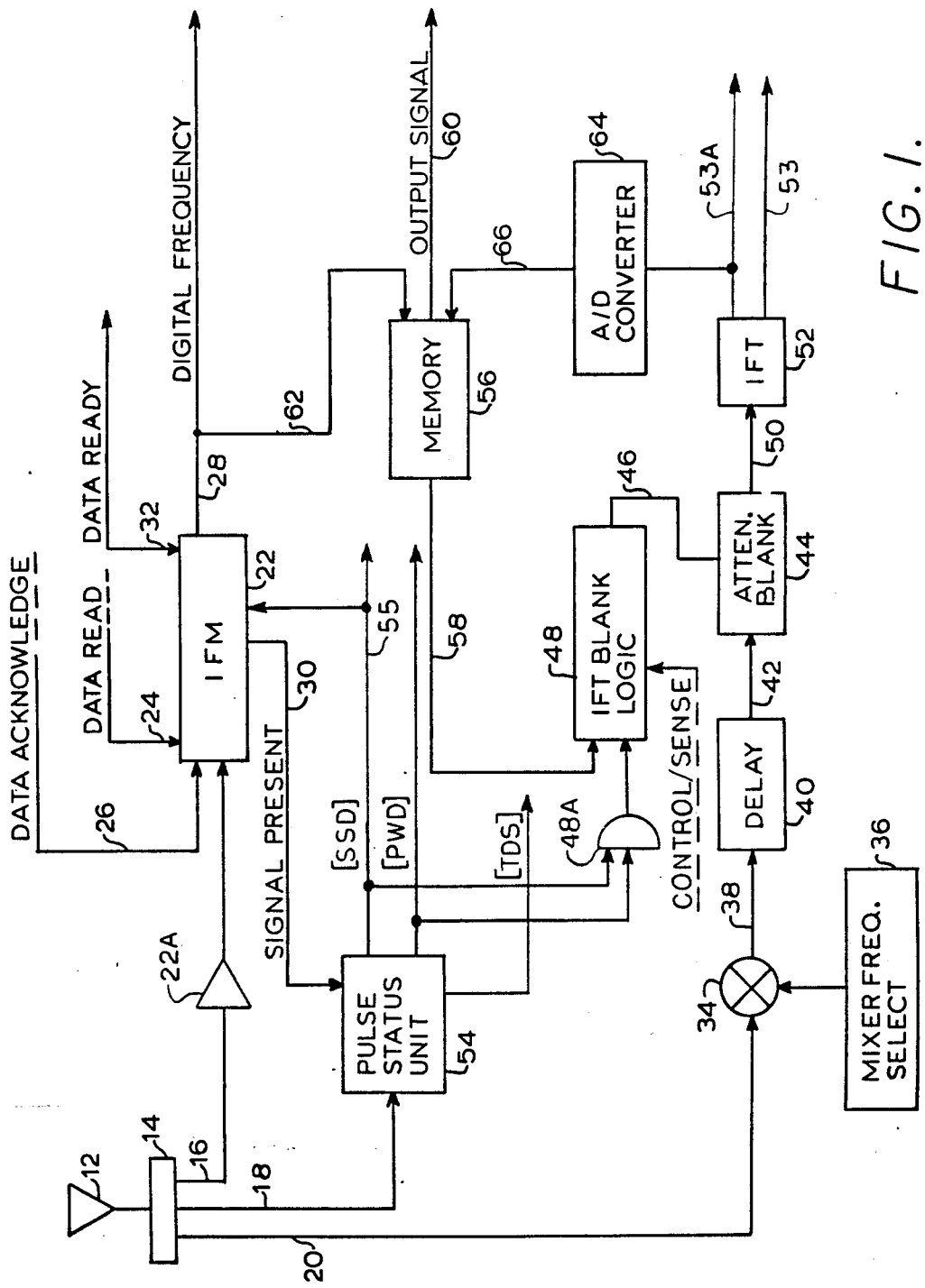
FIG. 1 is a block diagram showing the functional blocks of this invention.

An antenna 12 for receiving RF signal(s) is connected through a signal splitter 14 which divides the signal equally along three paths; the first path 16 leads to the IFM 22; the second path 18 leads to the pulse status unit 54, hereafter designated as PSU; the third path 20 leads to the IFT 52 via a frequency down-converter 34, 36, a delay line 40 and a remotely controlled attenuator 44.

The IFM is preceded by a limiting RF amplifier 22A. The purpose of the limiting amplifier is to provide the IFM with an amplified input signal of nearly constant amplitude, i.e., constant to within a few dB as measured by the power level of the output of the limiting amplifier. The removal of the major amplitude variations in the power level of the incoming signal is a prerequisite for the proper operation of the IFM. The design and construction of limiting amplifiers is well understood and a number of such devices are commercially available; several types of limiting amplifiers have been expressly designated to operate in conjunction with IFMs. A representative limiting RF amplifier is the AVANTEK AML-2000 Series GaAs FET output limited amplifier manufactured by Avantek, Inc., of Santa Clara, Calif. A representative IFM is the ANAREN DFD, Model 18260, manufactured by Anaren Microwave, Inc., of Syracuse, N.Y.

The limiting amplifier 22A may be an integral part of the IFM itself. Hence, in the following discussion, unless otherwise specified, whenever reference is made to an IFM, it is assumed to refer to a limiting amplifier-IFM combination.

The IFM 22 has three primary outputs: a DIGITAL FREQUENCY line 28, a SIGNAL PRESENT line 30, and a DATA READY line 32. The primary inputs are RF data input line 16B, DATA ACKNOWLEDGE line 26 and DATA READ line 24.

A cursory overview of some of the operating features of a typical IFM is helpful to an understanding of the function of these input and output control channels.

The IFM contains a built-in threshold detection circuit (not shown). Only if the detected signal strength exceeds a set (but adjustable) threshold value will the IFM process the signal and provide a digital frequency output signal which is a measure of the input frequency. This threshold prevents the IFM from operating on noiselike signals. The same internal threshold circuitry also generates an external control signal (a logical one or zero) which is called SIGNAL PRESENT when an incoming signal exceeds the threshold. A logical one signal indicates that the internal threshold has been exceeded and that the IFM is processing a signal. In an IFM typical of the present state-of-the-art, the SIGNAL PRESENT line 30 goes high (logical one) about thirty nanoseconds after the arrival of an RF signal at the input 16 of the IFM. After an additional 50 to 250 nanoseconds the DIGITAL FREQUENCY data is ready at the output channel 28 of the IFM. The presence of data on line 28 is indicated by the logical state of the DATA READY signal at line 32. The digital frequency data itself is held in a data storage register (not shown) which is internal to the IFM. No other incoming data is accepted by he IFM 22 in this condition until a DATA ACKNOWLEDGE signal is received on line 24.

The frequency data which is stored in the IFM can be read out after the DATA READY indication by application of a logical command (logical zero to logical one transition) to the DATA READ line 24.

The DATA ACKNOWLEDGE signal is ordinarily generated by a peripheral device (not shown) to which the frequency data word may be sent and indicates that the data has been successfuly received by that peripheral device. Upon receipt of the DATA ACKNOWLEDGE signal, the IFM resets itself to process subsequent signals. However, if a DATA ACKNOWLEDGE signal is not provided from an external source within ten nanoseconds for example, the IFM automatically resets itself.

One of the great advantages of the IFM receiver is its short response time which enables it to determine the frequency of the received radiation and to deliver this frequency in digital format within 50 to 250 nanoseconds. Thus, the IFM may operate in a number of modes. In particular, the IFM can be operated in a self-triggering mode which requires no external read command, and the data can automatically be transferred to any other point in the system or to any other peripheral device. After the IFM data has been transferred, the IFM automatically resets and is ready to receive the next RF signal.

Another advantage of the IFM receiver is its large band width which may extend from two GHz to six GHz, for example. For use involving countermeasures and other military objectives, such as friend-foe recognition, the short response time and the large bandwidth are most desirable qualities and are the primary reasons for the popularity of the IFM receiver. However, the IFM receiver also has a number of limitations which detract from its usefulness and which include its inability to process more than one received signal at one time. The IFM always selects the stronger signal for processing, which makes it susceptible to jamming when an undesired strong signal, having a long pulse duration or a continuous wave (CW) signal is received. The IFM receiver then processes only the jamming signal and is not receptive to other important or significant signals whose detection is the primary purpose of the receiver.

Another disadvantage of the IFM receiver is its inability to provide amplitude data of the received and processed signal.

Figure 2:
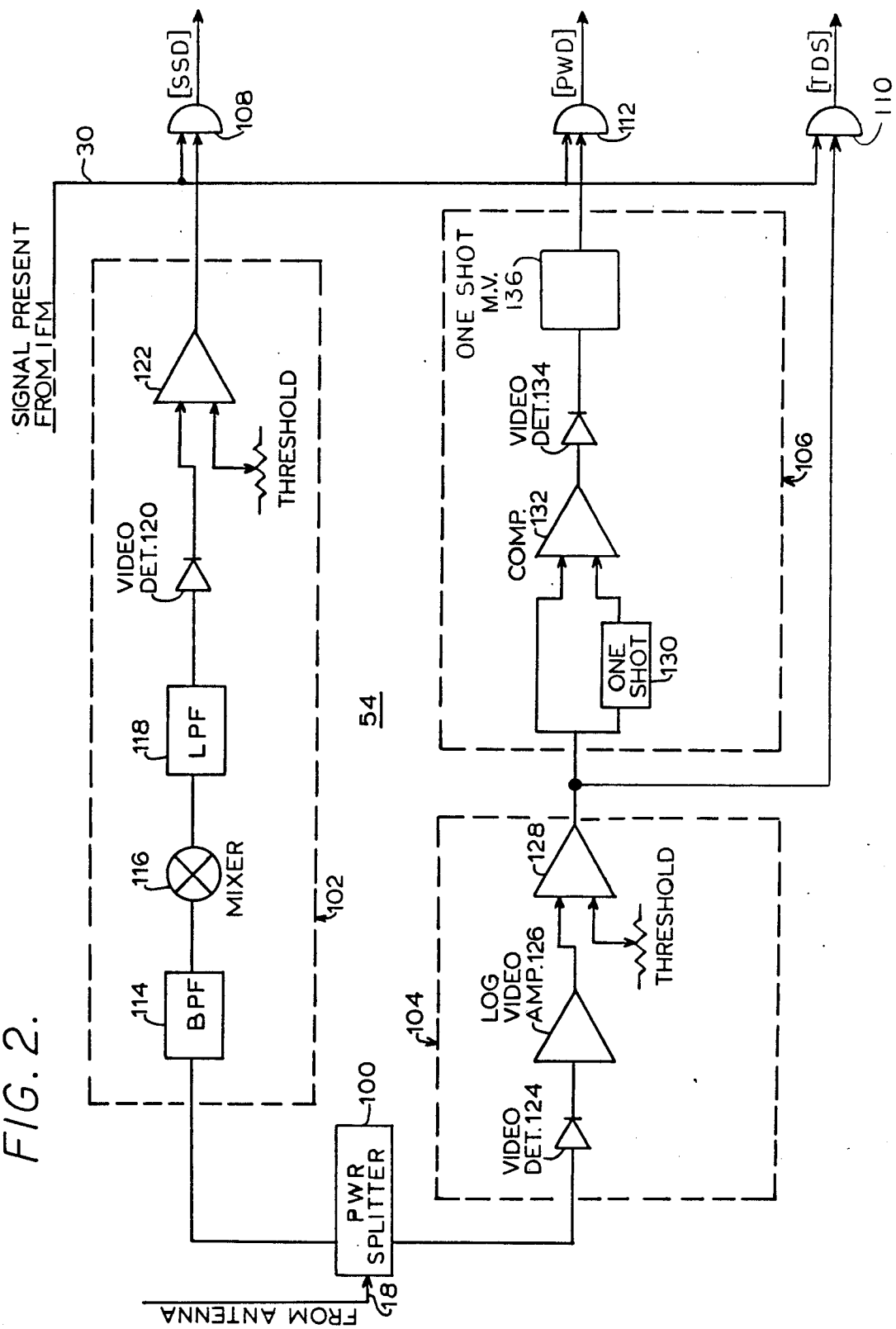
FIG. 2 is a block diagram of the Pulse Status Unit of FIG. 1.

The Pulse Status Unit 54 (PSU) contains circuits 102, shown in block form in FIG. 2, which detect the presence of simultaneous signals. One output of the PSU is a binary logical control signal (logical one or zero) called the simultaneous signal detection (SSD) status bit. If the presence or arrival of simultaneous signals is sensed, the SSD status bit is activated, i.e., a logical zero to logical one transition signal is produced. The (SSD) signal on line 55 is one of several status bits which may be delivered to the IFM 22 and be appended to the digital frequency data word. Such status bits carry information about the incoming signal.

The PSU also contains a threshold detector 104 which is adjusted over the full dynamic range of expected input signal power levels. The output, TDS, of the threshold detector 104 is a binary logical control signal (logical one or zero) which indicates that a prescibed threshold level has been exceeded. This threshold circuit is external to the IFM 22 and is adjusted either manually by the threshold potentiometer of amplifier 128 or by a computer (not shown).

More generally, a multi-threshold capability with multiple status bits or, alternatively, a digital encoding of the amplitude or power level of the signal may be incorporated (by means not shown).

The PSU 54 also contains a pulse width discriminator 106. A prescribed pulse width parameter is specified for the circuitry of 106. The value of the specified pulse width may be fixed or programmable. The output, PWD, of the pulse width discriminator 106 is a binary control signal which indicates that the pulse width has not exceeded the specified pulse width and the output signal is a logical zero, or that the pulse width does exceed the specified width and the output is a logical one. Usually the value of the specified pulse width is selected to include most conventional pulsed radar signals other than pulse doppler. A logical one then indicates the presence of either a continuous wave (CW) signal or a pulse longer than the specified width.

A typical PSU is shown in FIG. 2. A power splitter 100 splits the received RF signal into two branches, one being delivered to a simultaneous signal detector 102 and the other to the series combination of a threshold signal detector 104 which produces a TDS signal, and a pulse width discriminator 106 which produces the PWD signal.

Each of the three logical signals derived by the PSU 54, namely the outputs of units 102,104 and 106 are and-gated by gates 108, 110 and 112 with the SIGNAL PRESENT signal from the IFM 22 to ensure that the PSU and the IFM are processing the same signal. This logical combination takes place before the output lines leave the PSU. The "anded" outputs of 102, 104 and 106 are denoted hereinafter by (SSD), (TDS) and (PWD), respectively.

It is noted in FIG. 1 that the outputs (SSD) and (PWD) are "or"-ed by the action of the OR-gate 48A. The output of 48A provides one of the logical control signals which goes to the IFT blanking logic unit 48. This means that 48 is activated if at least one of the (SSD) or (PWD) lines are activated.

Simultaneous signal detector 102 comprises, in sequence, a suitable bandpass filter 114 having a, in this case, two to six gigahertz passband; a beat frequency mixer or detector 116 which produces a beat signal when two signals are simultaneously received; a low pass filter 118 having a cutoff frequency of, for example, four gigahertz; a video detector 120; and a high gain comparator 122 which is triggered when the difference between any two simultaneous signals received by filter 114 has a difference of six gigahertz or less. Such triggering produces a digital output signal which is either high or low.

It is recognized that the lowpass filter 118 determines the frequency separation beteween any two simultaneously occurring signals for which detector 102 produces a SSD signal. In the illustrated detector, a SSD signal is developed only when the simultaneously occurring signals are separated by not more than four gigahertz. The actual bandpass range is optional.

In operation, assume two simultaneous pulse signals occur at carrier frequencies of three and four gigahertz. Both pulses pass through the bandpass filter 114 and combine in the mixer 116 producing a difference frequency of one gigahertz during the period of overlap. This difference frequency is within the passband of the low pass filter 118. The one gigahertz difference frequency signal is detected by detector 120 and, if it is of sufficient amplitude, triggers the threshold amplifier to produce a SSD signal indicating that the IFM receiver 22 has received two simultaneous pulses frequency reading from the IFM which might be in error.

The RF signal is received by video detector 124 from power splitter 100, and the detected signal is delivered to the log video amplifier 126. The amplified video signals are compared in amplifier 128 to deliver a binary digital signal to the AND gate 110 whose output is designated the (TDS) signal.

Pulse width discriminator 106 only receives a logical signal when the TDS signal is high. The incoming signal triggers a one shot monostable multivibrator 130. The incoming TDS signal and the output of the multivibrator 130 are both delivered to the comparator circuit 132. If the lagging edge of the TDS pulse arrives before the multivibrator 130 returns to its stable condition, comparator 132 produces a negative output. If it arrives after the multivibrator returns to its stable condition, comparator 132 produces a positive output. Only the positive pulse is conducted from comparator 132 by the video detector 134 to the one shot monostable multivibrator 136. A positive pulse received by multivibrator 136 produces a binary digital signal indicating that the received pulse width exceeded the specified pulse width.

More generally, it is possible (by means not shown) to provide a quantized measure of the pulse width.

An RF attenuation and blanking control 44 has one input control line 46 for accepting control signals from the IFT blanking logic 48. The control signal on line 46 either blanks or unblanks, i.e., turns off or turns on the delivery of RF to the IFT 52.

Frequently it is desired to attenuate the RF signal to prevent saturating the IFT. Control of the attenuator for this purpose can be provided by a form of fast acting automatic gain control (AGC not shown), the design of which is well known to those skilled in the art.

A delay line 40 is connected to delay the RF signal sufficiently for the operation of the PSU 54, the IFM 22, the frequency Screens, logic circuits 48, attenuator 44 and other auxilary circuits (not shown) to operate before the signal is routed to the IFT 52.

The IFT accepts RF signals over a bandwidth designated $f_1$ to $f_2$. If the RF signals of interest fall outside of the IFT frequency range, means 34, 36 down-convert (or up-convert) the frequency of the RF signals into the acceptance bandwidth of the IFT. Only the down-conversion process is mentioned, but it is understood that up-conversion is implied where appropriate.

Block 56 represents a frequency screen. The preferred means of implementing the frequency screen is by a conventional 1×n random access memory device or RAM. The number n is the number of discrete frequency values or elements which the IFM or the IFT produces. The value of n1 which characterizes the IFM need not be identical to the value of n2 which characerized the IFT, and n should be the larger of n1 or n2. The terms freqency screen and frequency memory sceen are defined to be synonymous.

To describe the operation of the frequency screen 56, consider a digital representation of the frequency outputs coming from the individual frequency elements of the IFM or IFT. Let $i = 1, 2, \ldots, n$ represents an integer label or index of the frequency elements and let $d(i)$ be the digital address for this element. Corresponding to each of the n frequency elements of the IFM or IFT there will be a unique memory location, whose address may also be taken to be $d(i)$.

Each of these memory locations of the frequency screen 56 is assumed to contain either a logical one or a logical zero. If the i-th memory location of the freqency screen is addressed it reads out the content of the i-th memory location, namely either a logical zero or a logical one. The frequency screen 56 acts as a logical mask to deliver a binary status or control bit to enable or inhibit a data transfer at some remote contol point. The frequency screen 56 may be regarded as an array of n programmable binary frequency filters, each memory cell or filter being either a frequency-reject (logical zero) filter, or a frequency-pass (logical one) filter. The memory locations of the RAM may modified in a manner identical with any conventional RAM.

Sometimes a programmable read only memory (PROM) is used instead of a RAM. Usually a RAM is preferred because it may be altered within microseconds.

The IFT 52 is an acousto-optic or electro-optical device (details not shown herein) which provides radio frequency measurements of the incoming RF signals. The output of the IFT is derived from a linear array of n photodetectors (not shown). Unlike the IFM, the IFT can measure the frequencies of a number of simultaneous signals.

The IFT 52 may, for example, be an ITEK IFT Model 200-1 manufactured by ITEK, Applied Technology Division, of Sunnyvale, Calif. which uses a HeNe gas laser. Other similar devices which use a solid state laser have been demonstrated. The same fundamental principles of operation apply to either type of device.

The manner in which the photodetector array is read depends upon the design of the readout logic of the array. Two techniques are typically used. In the first, or sequential embodiment (not shown), data from n parallel photodetectors is held in an analog shift register, and the data is shifted out in a manner analogous to a conventional sequential shift register. In the second, or random access embodiment (not shown), the array of photodetectors is digitally addressed and read out in a manner analogous to the addressing and reading of a conventional RAM. Note however that, in both embodiments, the data is in analog rather than digital form, and that an analog to digital converter 64 converts the photodetector responses into digital form for signal analysis, storage and for use in the frequency screen 56.

Each photodetector (not shown) of the IFT 52 responds to the energy which is incident upon that photodetector, and it produces amplitude information. This represents another point of difference between the IFT and IFM, namely that the IFM is incapable of providing amplitude information.

The frequency information of the IFT is provided by the label or index of the i-th photodetector. Thus, the data format on line 28 differs from the data on line 66, since the latter depends upon the embodiment of the readout logic used with the photodetector array (not shown).

If amplitude information is not used, the reformatting of the IFT data into a format identical to that of the IFM 22 is easily accomplished.

If amplitude information is desired, it may easily be digitized, and it is intended herein that such means are included as part of the IFT subsystem. In fact, the ITEK IDI, series 500 is such a device; it is specially designed to be a companion unit to the IFT model 200-1 mentioned above and to provide an interface which permits the IFT to be used with oscilloscopes, computers, tape recorders, and a variety of other peripheral devices. Herein it is assumed that the IFT 52 has two digital outputs: (i) an output on line 53A which contains the no amplitude information and which represents an enumeration of the frequencies measured by the IFT; and (ii), an "extended" output on line 53 which carries the amplitude data which is associated with each delivered frequency value.

The functioning of the invention is understood by referring to the signal flow paths which are shown in FIG. 1.

The RF signal from the source 12 enters the system via a three-way signal splitter 14 which produces three equal signals on lines 16, 18 and 20. The signal on line 16 goes through amplifier 22A to IFM 22, and it is processed by that device in the manner described above.

When a signal is received, a SIGNAL PRESENT signal is generated which is sent on line 30 to the PSU 54. After a nominal processing delay of 50–300 nanoseconds, a digital signal which is a measure or designation of the frequency of the incoming signal is delivered to line 28 and also, through line 62 to the frequency screen memory 56.

The operation of the frequency screen 56 is described above. The essential characteristic of the frequency screen is to screen the data and, on the basis of a stored binary decision rule to generate a logical control signal. If and when such control signal is generated it is transmitted to logic 48 and, through line 60, to other peripheral signal processing means (not shown). The logical circuit 48 is a simple logical "inhibit" gate whose inputs are the binary output of OR-gate 48A and the binary output of the frequency screen 56.

A optional provision may be made within block 48 for an enable/inhibit function labeled CONTROL/SENSE to provide a capability of accepting conditional data transfer commands which may be generated by a computer or other ancillary means to reject (or accept) selected incoming signals based on such commands.

The signal on line 18 goes to PSU 54 to produce outputs designated (SSD), (TDS) and (PWD) which are made available for (any subsequent data processing which involves the frequency data on line 28. Frequency data is also transferred to the frequency screen 56 which has been described above. The (TDS) output of PSU 54 used as a logical control and verification signal to establish that the frequency data output on line 28 coincides with the same signal which is detected by the PSU. It is also used in conjunction with ancillary means, such as a computer (not shown) to control the level setting of an RF attenuator (not shown) in lines 16 or 20.

The output of logical circuit 48 enables or inhibits the variable attenuator blanking circuitry 44. The ouput of logic 48 may be either an analog control voltage or a digital logic level. An optional input to block 44, (not shown) may provide for intermediate attenuation levels when strong signals are received which would overload the circuits of IFT 52.

The signal on line 20 is delivered to frequency downconverter 34 where it is frequency down-converted; the down-converted signal is delivered through the RF delay line 40 and the attenuator-blanker 44 to the IFT 52 which operates at the down-converted freqency. The time delay which is provided by block 40 is a fixed value, and it is chosen to be longer than the combined delay of the enable/inhibit command input on line 46, and the response time of the attenuator blanker 44. Thus, the signals which are detected and processed by the circuitry and logic of elements 22, 54, 56 and 48 are prevented from entering the IFT 52.

In a particular operation, the frequency screen 56 contains a previously recorded listing of expected frequencies (or frequency ranges). This information is, in that operation, separated into two categories. For discussion purposes, designate the two categories as category I and category II, respectively. Frequencies belonging to category I will constitute that portion of the frequency screen which is used to inhibit signals from reaching the IFT. Category I might for example include pulsed doppler signals, and other signals which are to be excluded or excised from further signal processing, based on frequency information. Frequencies belonging to category II are used to enable signals so that they are routed to the IFT. New pulses which may be encountered and which may not be listed in any portion of the frequency screen(s) will still be processed by the system and be made available for subsequent signal processing. These or other signals can be subsequently entered into the memory of the frequency screen(s) with the aid of an ancillary computer (not shown) using familiar memory addressing techniques.

Thus, the apparatus of this invention allows the best features of the IFM to be utilized, and when a pulse cannot be analyzed by the IFM, it is delivered to the IFT for analysis. Both the IFM and the IFT deliver information into the memory 56 so that incoming radar signals, and the like, may be catalogued for further use.

To emphasize the operation and importance of the invention, six different frequently encountered scenarios and the operation of the invention are now described.

Signal Scenario One

The received signal is only a single long pulse or a steady CW signal.

The received signal is delivered to the IFM receiver 22 via lead 16, and assuming the signal to be above the minimum threshold to which the IFM receiver is adjusted, it is processed by that receiver. About fifty nanoseconds after receipt of the signal, the receiver 22 delivers a SIGNAL PRESENT signal to line 30 and the PSU 54. About fifty to two hundred nanoseconds later a DATA READY signal is delivered by the IFM to line 32 indicating the presence of digital frequency information in the output register (not shown) in the IFM 22. If auxiliary equipment (not shown) desires to transfer the digital frequency information, it may do so by delivering a signal to the DATA READ line 24, and upon receipt of such information, an acknowledgement of such receipt is typically delivered to the DATA ACKNOWLEDGE line 26 to reset the IFM to receive another RF signal.

According to the prior art, the IFM receiver may alternatively be constructed to eliminate the DATA READ and DATA ACKNOWLEDGE lines with the IFM delivering its frequency information as soon as it is available and resetting as soon as the information is delivered.

The long pulse or CW signal is simultaneously delivered to the PSU 54. Assuming that the signal is above a predetermined level, a TDS signal is produced by the threshold detection circuit 104 and delivered to the pulse width detector 106. Because the received pulse is longer than the specified pulse width built into the detector 106, a PWD signal is high. The high signal bit is sent to the IFT blank logic 48 to cause the blanking circuit 44 to become unblanked.

The received RF pulse or CW is also received by mixer 34 where its RF frequency is modified(down-converted). The modified frequency signal is delayed by the delay 40 where it is held, for example, for five microseconds to give the blanker 44 time to be actuated and to unblank. The modified RF signal is then delivered through the unblanked circuit 44 to the IFT receiver 52 which produces signals that are measures of the frequency and amplitude of the incoming signal.

Signal Scenario Two

Assume that the received RF signal is a short pulse whose width is less than a predetermined width so that the PWD control signal produced by the PSU 54 is in the logical state that does not unblank the blanker 44, thereby preventing the short pulse from reaching the IFT receiver 52. Only the DIGITAL FREQUENCY output of the IFM is delivered to the memory 56 and to peripheral equipment.

Signal Scenario Three

Assume that the received RF signal is a short pulse of high amplitude in the presence of a CW or long pulse of lower amplitude, and that both pulses have concurrent leading edges.

Because of the concurrent leading edges of the two signals, the IFM receiver 22 locks onto the higher amplitude short pulse and produces frequency data for that pulse. The PSU 54 produces an SSD signal which is indicative of the presence of two concurrent signals, and which implies that the frequency measured by the IFM 22 may be untrustworthy and should perhaps be disregarded. The IFT is then enabled and the measurement of each independent signal is made by the IFT based upon the frequency difference of the two signals. The frequency measurement of the lower amplitude CW is also performed by the IFM once the short pulse of higher amplitude is no longer present.

Signal Scenario Four

Assume that the received RF signal is a CW or long pulse of low amplitude concurrent with a high amplitude short pulse and that the leading edge of the low amplitude pulse occurs first.

The IFM 22 starts to process the low amplitude pulse, but the high amplitude pulse arrives before the processing of the low amplitude pulse is completed. The IFM locks onto the higher amplitude pulse for the period of its duration, producing an unreliable frequency measurement. The PSU 54 produces these signals: the (SSD) goes high upon receipt of the short pulse; the (PWD) is initially low and the blanking circuit 44 allows the signal to reach the IFT 52, which measures the frequencies of both signals. When the short high amplitude pulse is no longer present, the IFM receiver 22 continues to receive the long pulse or CW. The IFM 22 produces frequency data for the long pulse; after four microseconds (typically), the PSU produces a (PWD) signal that unblanks the circuit 44 and allows the incoming signal to reach the IFT 52 where both the long pulse and short pulse are analyzed for their frequency and amplitude, and frequency data is produced and delivered through the converter 64 to the memory 56.

Pulse Scenario Five

Assume that the received signal comprises multiple long pulses of varying amplitude, some of which overlap in time. IFM receiver 22 provides frequency data for the highest amplitude pulse, and it delivers a SIGNAL PRESENT signal to line 30.

PSU 54 receives several long pulses and delivers a (SSD) and a (PWD) signal which unblanks the blanker 44 and allows the received signal to be delivered to the IFT receiver 52 where all pulses, assuming them to be within the band width of the IFT receiver, are analyzed and their frequencies and amplitudes are delivered to line 60; frequency data is delivered to the memory 56. Jamming of the IFM receiver 22 by a strong CW signal causes the IFT to process the concurrent incoming pulses and thwart the jamming signal.

Signal Scenario Six

Assume that the received signal consists of multiple short pulses of different amplitudes. If there is no overlapping of the pulses, the received signal is processed by the IFM receiver 22, and the PSU 54 does not enable the blanking network 44 to transmit the signals to the IFT receiver 52. Whenever the pulses overlap, the SSD signal is produced by the detector 102, indicating the frequency date from the IFM is unreliable. For example, if the first received pulse is a high amplitude pulse, and a second pulse is a low amplitude pulse, the IFM processes the high amplitude pulse, and the frequency data is reliable. When, however, the first pulse is a low amplitude pulse, the IFM starts to process the pulse but subsequently switches to the higher amplitude pulse, and the frequency data is then unreliable. The (SSD) signal pulse is entered into the IFM output register as a digit which can be read during subsequent use of the frequency data to tell the user that the data is unreliable.

Frequency Scenario Seven

Assume that the received signal has multiple long and short pulses of varying amplitudes, the situation most often encountered. IFM receiver 22 at all times processes the strongest pulse to which it is exposed. When pulses arrive simultaneously, the (SSD) signal warns the user that the IFM frequency data may be unreliable. The SIGNAL PRESENT signal "and"-ed with the PWD signal opens the blanker 44 when the pulses are sufficiently long. The long concurrent pulses are delivered to the IFT for processing.

When the signal delivered to the memory 56 is of a frequency that matches particular predetermined category I (inhibit) frequencies stored therein, a signal is delivered to line 58 to inhibit the operation of the blanking logic 48. These frequencies are of no interest to the operator of the apparatus, and the delivery of a signal on line 58 prevents delivery of such "no interest" signals to the IFT 52.

The output signal paths are 28, 53 and 60. The signal line 60 is a priority line which carries only an indication of which important frequencies are active. That is, it provides a binary (0,1) indication of which elements d(i) of the frequency screen are momentarily active. The other lines 28 and 53 carry the actual frequency measurements, status bits, and whatever amplitude information is available. The important frequencies, categories I and II, are stored in the memory 56, and when one of the category II frequencies is received from the IFM or IFT, it is delivered on the priority line of 60.

There has been described herein an electromagnetic signal receiver and processor which produces frequency data for received signals and which includes most of the advantages of an IFM receiver such as speed and bandwidth. It also includes most of the advantages of the IFT receiver such as both amplitude and frequency data for multiple signals. Further, the device is not subject to ordinary jamming since any attempt to jam the IFM receiver produces a signal that operates logic networks to allow all other signal to be delivered to the IFT receiver.

Although the invention has been described in detail above, it is not intended that the invention shall be limited by that description but only according to the following claims in combination with that description.

We claim:

1. In combination:
    An IFM receiver (22), including a limiting amplifier (22A) for limiting the amplitude of a signal delivered thereto, for producing a SIGNAL PRESENT signal indicative of the presence of such signal, for producing a first DIGITAL FREQUENCY signal which is a digital measure of such signal, and for producing a DATA READY signal indicative of the presence of the digital frequency signal;
    A pulse status unit, responsive to said SIGNAL PRESENT signal for producing at least a (SSD) signal, and a (PWD) signal, said (SSD) signal being delivered to said IFM as a tag signal for said DIGITAL FREQUENCY signal;
    An IFT receiver, blanking means for inhibiting the input to said IFT receiver, delay means for delaying the input to said IFT receiver, and heterodying means for shifting input signals into the frequency range of said IFT receiver;
    Means for channeling incoming radio frequency pulses to said IFM receiver, said IFT receiver and said pulse status unit;
    Blanking logic means responsive to said PWD signal for controlling said blanking means;
    An analog/digital converter connected between the output of said IFT receiver to convert the output of said IFT into digital form; and
    Memory means for receiving and storing said DIGITAL FREQUENCY signal from said IFM and frequency information from said analog/digital converter.

2. Apparatus as recited in claim 1 and further comprising a control connection between said memory and said blanking logic means to inhibit signals to said IFT by said blanking means when the frequencies of incoming signals are of certain predetermined frequencies.

3. Apparatus as recited in claim 2 wherein said IFT is an acousto-optical apparatus.

4. Apparatus as recited in claim 1 wherein said IFT is an acousto-optical apparatus.

5. An electromagnatic signal receiver and processor for providing frequency data of received RF signals, the signal receiver and processor comprising:
   IFM receiver means responsive to said received RF signals and operative to provide digital data of the frequencies present in said received RF signals;
   a pulse status unit responsive to said received RF signals and operative to provide an unblanking signal only when a received RF signal has a pulse width greater than a predetermined width;
   a mixer responsive to said received RF signals and operative to provide intermediate frequency signals;
   delay means responsive to said intermediate frequency signals and operative to delay such signals by a predetermined time interval;
   IFT receiver means responsive to said delayed signals and operative to provide spectral data of the frequencies present in said delayed signals; and
   blanking means disposed beween said delay means and said IFT receiver means which normally blank a signal applied thereto, said blanking means being responsive to said unblanking signal and operative to unblank said blanking means to allow said delayed signals to pass to said IFT receiver means or normal processing.

6. An electromagnetic signal receiver and processor in accordance with claim 5 in which said pulse status unit includes a pulse width discriminator which is responsive to the leading edge of a pulse of said received RF signals and operative to determine the occurrence of the expiration of a time interval commensurate with said predetermined width, prior to the occurrence of the lagging edge of said pulse, and which generates said unblanking signal only when said lagging edge occurs after said time interval has expired.

7. An electromagnetic signal receiver and processor in accordance with claim 6 in which said pulse status unit further includes a threshold detector which is responsive to the amplitude of said received RF signal and operative to provide a threshold detector output signal only when the amplitude of said received RF signal is greater than a preselected threshold amplitude, said pulse width discriminator operating on said threshold detector output signal.

8. An electromagnetic signal receiver and processor in accordance with claim 7 in which said pulse status unit further includes a simultaneous signal detector which is responsive to signals of different frequencies and operative to provide a simultaneous signal detector signal upon the occurrence of at least two signals differing in frequencies, the presence of a simultaneous signal detector signal providing an indication to a user of possible unreliability of the digital data of the frequencies provided by said IFM receiver means.

9. An electromagnetic signal receiver and processor in accordance with claim 8 in which said blanking means is also responsive to a further unblanking signal, and which further includes a memory in which a plurality of preselected frequencies are stored, and means for comparing the data of the frequencies developed by said IFM receiver means with said preselected frequencies and for developing said further unblanking signal only in the absence of a match of such frequencies.

10. An electromagnetic signal receiver and processor in accordance with claim 9 in which said blanking network responsive to said unblanking signal and said further unblanking signal and for unblanking said blanking network upon the occurrence of either or both.

11. The method of receiving and processing electromagnetic signals with the parallel combination of an IFM receiver and an IFT receiver to derive frequency data of the received electromagnetic signals, the method comprising the steps of:
   receiving the electromagnetic signals and developing received RF signals;
   applying one portion of the received RF signals directly to the IFM receiver for generating digital data of the frequencies present in the received RF signals;
   determining whether the pulse width of the received RF signals exceeds a preselected pulse width;
   converting another portion of the received RF signals to an intermediate frequency domain which is commensurate with the input requirements of the IFT receiver;
   delaying the intermediate frequency signals a preselected time interval which is not less than the time interval required to make the pulse width determination; and
   applying the delayed signal to the IFT receiver for generating spectral data of the frequencies present in said delayed signals only in the event that the pulse width of the corresponding RF signal exceeds the preselected pulse width.

12. The method of receiving and processing electromagnetic signals in accordance with claim 11 in which the pulse width determination is made by first noting the leading edge of the pulse and then determining whether the selected time interval expires prior to noting the lagging edge of the pulse.

13. The method of receiving and processing electromagnetic signals in accordance with claim 12 in which the determination of the pulse width is preceded by the step of determining the amplitude of the pulse and determining the pulse width only if the amplitude exceeds a preselected threshold amplitude.

14. The method of receiving and processing electromagnetic signals in accordance with claim 13 including the further step of developing the difference frequency of any simultaneously received RF signals and developing a simultaneous signal in the event that such difference frequency is outside the frequency range of the received and processed electromagnetic signals to indicate the potential unreliablity of the derived frequency data.

15. The method of receiving and processing electromagnetic signals in accordance with claim 14 which includes the steps of storing certain frequencies in a memory, comparing the derived frequency data with the stored frequencies, and applying the developed signal to the IFT receiver only in the absence of a frequency match.

* * * * *